(12) United States Patent
Tung et al.

(10) Patent No.: US 8,178,262 B2
(45) Date of Patent: May 15, 2012

(54) METHOD FOR FABRICATING COLOR FILTER LAYER

(75) Inventors: Chun-Hao Tung, Hsinchu (TW); Jui-Yin Chung, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 60 days.

(21) Appl. No.: 12/830,425

(22) Filed: Jul. 5, 2010

(65) Prior Publication Data

US 2010/0291479 A1 Nov. 18, 2010

Related U.S. Application Data

(63) Continuation of application No. 11/695,620, filed on Apr. 3, 2007, now Pat. No. 7,811,724.

(30) Foreign Application Priority Data

Dec. 25, 2006 (TW) .............................. 95148803 A

(51) Int. Cl.
*G02B 5/20* (2006.01)
(52) U.S. Cl. .......................................................... 430/7
(58) Field of Classification Search ........................ None
See application file for complete search history.

(56) References Cited

U.S. PATENT DOCUMENTS

2006/0250536 A1* 11/2006 Kim ................................ 349/43

FOREIGN PATENT DOCUMENTS

| JP | 10-096913 | 4/1998 |
| JP | 10-282523 | 10/1998 |
| JP | 2000-098367 | 4/2000 |
| JP | 2000-162643 | 6/2000 |
| JP | 2002-040227 | 2/2002 |
| JP | 2002-277624 | 9/2002 |

OTHER PUBLICATIONS

Computer-generated translation of JP 2000-162643 (Jun. 2000).*

* cited by examiner

*Primary Examiner* — John A. McPherson
(74) *Attorney, Agent, or Firm* — Jianq Chyun IP Office

(57) ABSTRACT

A method of fabricating a color filter layer is provided. An active device array substrate having an opaque metal pattern formed thereon is provided. A planarization layer covering the opaque metal pattern is formed. A back-side exposure process is performed on the active device array substrate using the opaque metal layer as a mask to form a black matrix thereon, wherein the black matrix defines a plurality of pixel regions. A plurality of color filter patterns is formed in the pixel regions.

24 Claims, 10 Drawing Sheets

METHOD FOR FABRICATING COLOR FILTER LAYER

CROSS-REFERENCE TO RELATED APPLICATION

This is a continuation application of and claims the priority benefit of patent application Ser. No. 11/695,620, filed on Apr. 3, 2007, now pending, which claims the priority benefit of Taiwan application serial no. 95148803, filed on Dec. 25, 2006. The entirety of each of the above-mentioned patent applications is hereby incorporated by reference herein and made a part of this specification.

BACKGROUND OF THE INVENTION

1. Field of the Invention

The present invention relates to a method of fabricating a color filter pattern. More particularly, the present invention relates to a method of fabricating a color filter pattern with no alignment error.

2. Description of Related Art

Because a cathode ray tube (CRT) display has superior displaying quality and economical characteristic, The CRT display has dominated the market of display devices for quite some time. However, with the rising environmental protection awareness, the CRT display has many disadvantages such as the bulkiness of the display, it requires more space and higher power consumption that diminish its desirableness in a multi-terminal desktop environment. Thereof, the CRT display cannot meet the present trend of being light, thin, short, small, and lower power consumption. Therefore, a thin film transistor liquid crystal display (TFT-LCD) with superior characteristics of high definition, smaller space utilization, low power consumption, and no radiation has gradually become a mainstream of the display market.

As the size of the TFT-LCD becomes larger, a color filter on array (COA) structure has been widely used in many LCDs.

There are many factors affecting the quality of the TFT-LCD panel, and the most critical factor influencing the display quality is the contrast, and the most critical parameter influencing the contrast is brightness. The brightness is also affected by many factors such as luminance of the backlight, transmittance of each thin film layer, aperture ratio, alignment accuracy of the black matrix, and assembly accuracy of the color filter layer. However, the above-mentioned parameters affecting the brightness can be improved by using suitable material or design, except that the assembly accuracy of the color filter and the alignment accuracy of the black matrix are limited by the capability of the equipment and they are difficult to be adjusted, which thus reduces the transmittance of the panel.

SUMMARY OF THE INVENTION

In view of the problems of the conventional art, the present invention is directed to a method of fabricating a color filter layer, wherein the possibility of occurrence of alignment error of the black matrix and errors in the assembly of the color filter layer may be effectively reduced.

The present invention provides a method of fabricating a color filter layer, which includes the following steps. An active device array substrate having an opaque metal pattern formed thereon is provided. A planarization layer covering the opaque metal pattern is formed. A back-side exposure process is performed on the active device array substrate using the opaque metal layer as a mask to form a black matrix thereon, wherein the black matrix defines a plurality of pixel regions. A plurality of color filter patterns is formed in the pixel regions.

The present invention further provides a method of fabricating a color filter layer, which includes the following steps. An active device array substrate having an opaque metal pattern formed thereon is provided. A planarization layer covering the opaque metal pattern is formed. A black positive photoresist layer is formed to cover the planarization layer. A back-side exposure process is performed to expose the black positive photoresist layer by using the opaque metal pattern as a mask. A development process is performed such that the black positive photoresist layer is transformed into a patterned black positive photoresist layer, and a plurality of pixel regions is defined by the patterned black positive photoresist layer. A plurality of color filter patterns is formed in the pixel regions.

Accordingly, in the method of fabricating the color filter layer of the present invention, as the black matrix is formed on the active device array substrate through the back-side exposure process using the opaque metal pattern in the active device array substrate as the mask, and therefore the possibility of alignment error during the fabrication of the black matrix may be effectively reduced. This would also help reducing the assembly error of the color filter layer. Moreover, the method of fabricating the color filter layer of the present invention is capable of saving at least one photomask, and thus the fabrication cost of the panel can be effectively reduced.

According to another aspect of the present invention, the black matrix is disposed on the active device array substrate over the opaque metal pattern, and the black matrix and the opaque metal pattern have the same pattern, and therefore the aperture ratio can be effectively increased.

In order to make the aforementioned and other objectives, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
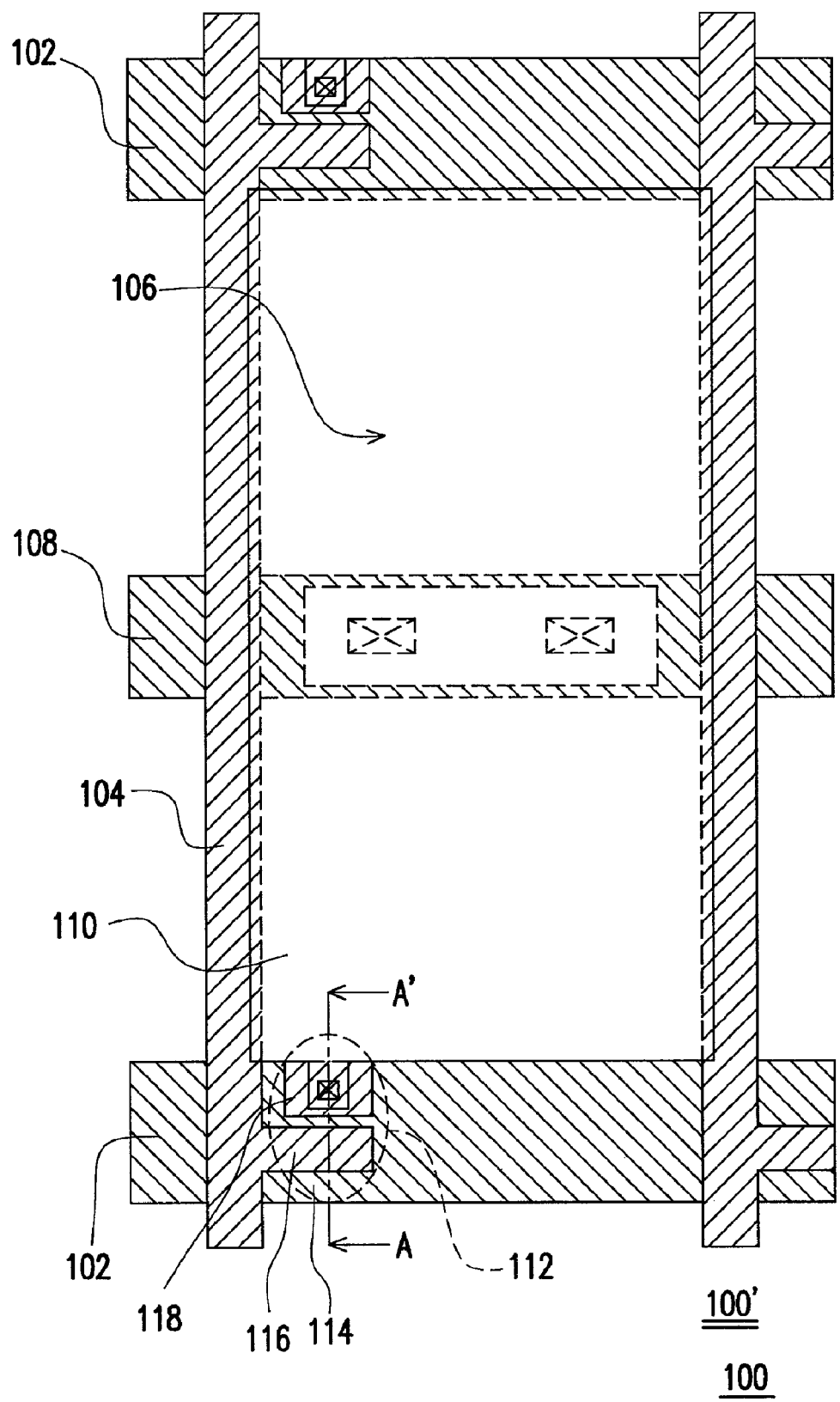
FIGS. 1A and 1B are top views of a flow chart illustrating a method of fabricating a color filter layer according to an embodiment of the present invention.
Figure 1B:
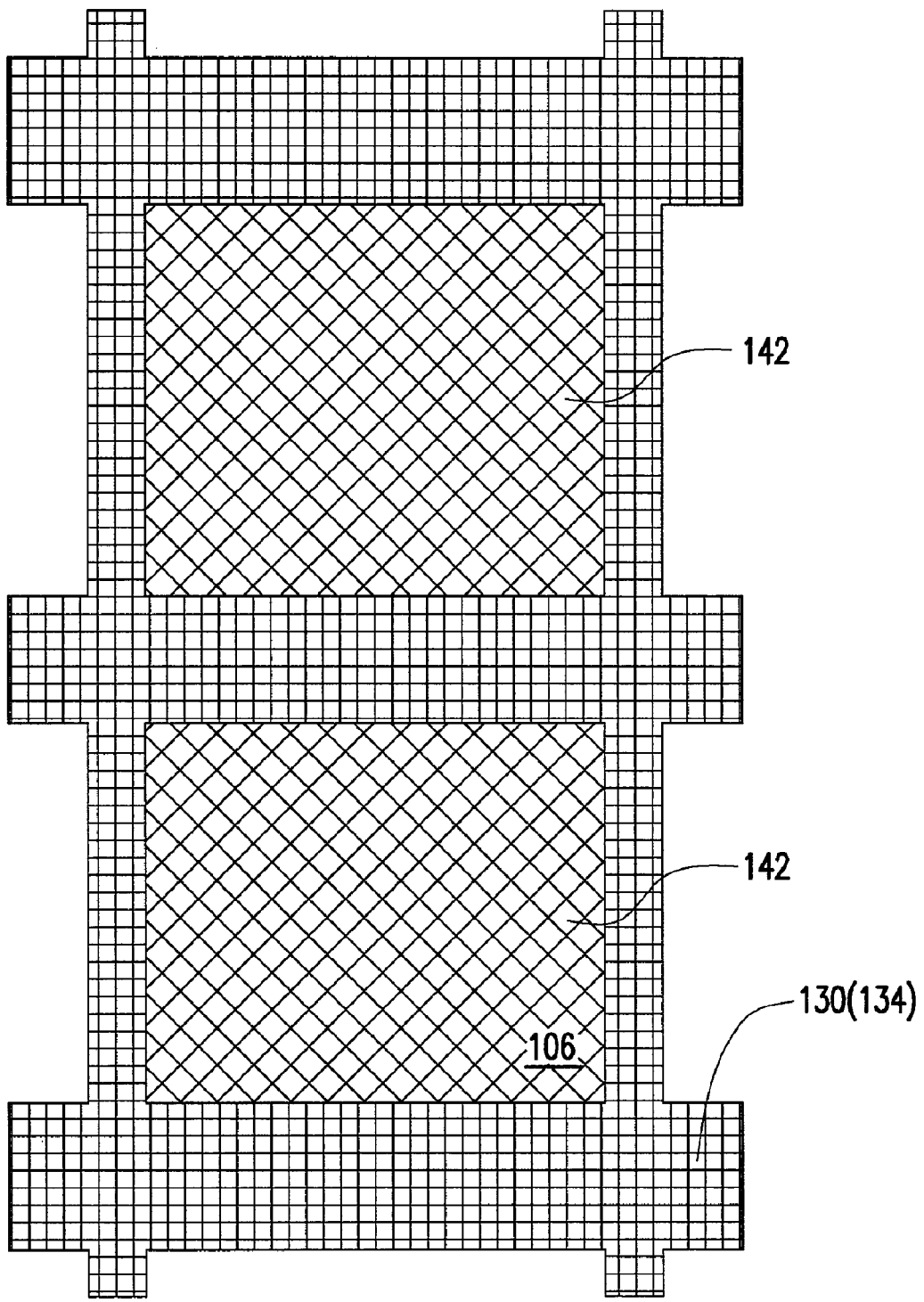

FIGS. 1A and 1B are top views of a flow chart illustrating a method of fabricating a color filter layer according to an embodiment of the present invention.

First, referring to FIG. 1A, an active device array substrate 100, e.g., TFT array substrate, is provided. In the active device array substrate 100, a plurality of scan lines 102 and a plurality of data lines 104 on a substrate 100' form a plurality of pixel regions 106. A plurality of common lines 108 passes through the pixel regions 106, pixel electrodes 110 are located in the pixel regions 106, and each of the TFTs 112 is located at an intersection point between the scan line 102 and the data line 104. In this embodiment, the opaque metal pattern is formed by metal patterns such as the scan lines 102, the data lines 104, the common lines 108, gates 114, sources 116, and drains 118 of the TFTs 112. However, the present invention is not limited as such. Persons skilled in the art that would understand that any opaque metal layer in the active device array substrate can be used as the opaque metal pattern, which shall be construed to be within the scope of the present invention.

Hereinafter, for a method of fabricating the black matrix is illustrated below with reference to FIG. 1A.

FIGS. 2A to 2D are cross-sectional views taken along a section line A-A' in FIG. 1 showing the steps of a method of fabricating the color filter layer according to an embodiment of the present invention.

Figure 2A:
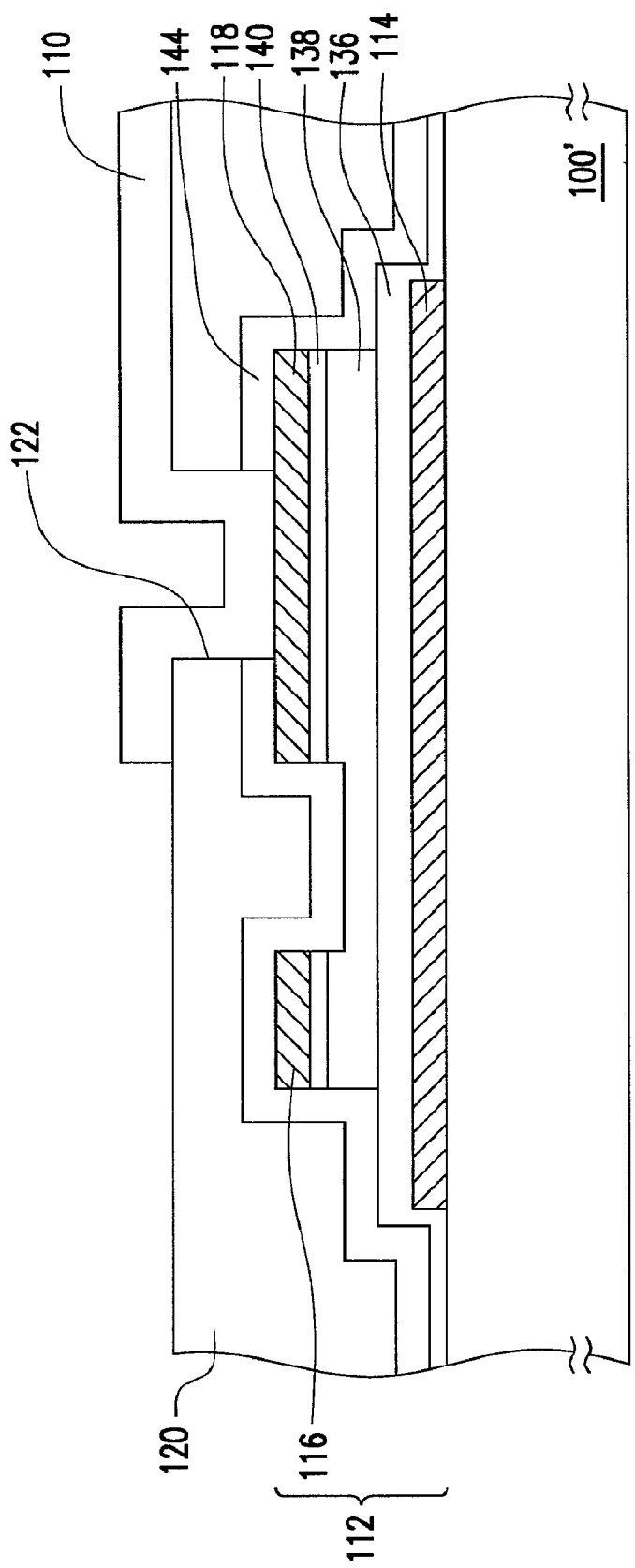
FIGS. 2A to 2D are cross-sectional views taken along a section line A-A' in FIG. 1 showing the steps of a method of fabricating the color filter layer according to an embodiment of the present invention.

First, referring to FIG. 2A, a substrate 100' having a TFT 112 thereon is provided. The opaque metal pattern of the TFT 112 is comprising the gate 114 (in the same metal layer as the scan line 102 in FIG. 1), the source 116 and the drain 118 (in the same metal layer as the data line 104 in FIG. 1). A planarization layer 120 covers the TFT 112, and has an opening 122 to expose the drain 118. A pixel electrode 110 is electrically connected to the drain 118 through the opening 122. A gate dielectric layer 136, a semiconductor layer 138, and an ohmic contact layer 140 is disposed between the gate 114 and the source 116, the drain 118 from bottom to top. A protection layer 144 is disposed between the planarization layer 120, and the source 116 and the drain 118.

Figure 2B:
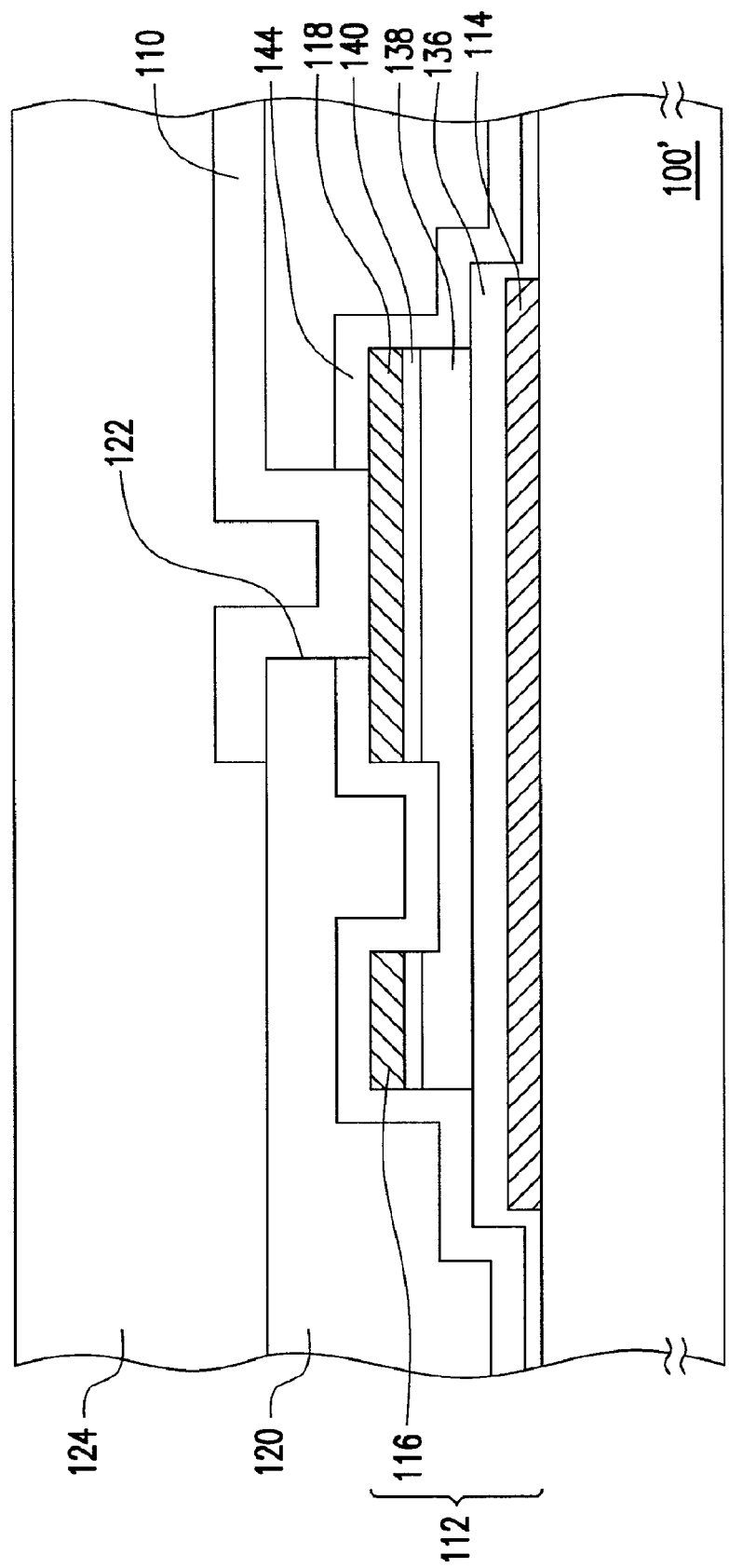

Next, referring to FIG. 2B, a negative photoresist layer 124 is formed over the substrate 100' to cover the planarization layer 120 and the pixel electrode 110. Next, a back-side exposure process is performed on the negative photoresist layer 124 using the opaque metal layers such as the gate 114, the source 116 and the drain 118 of the TFT 112 as a mask.

Figure 2C:
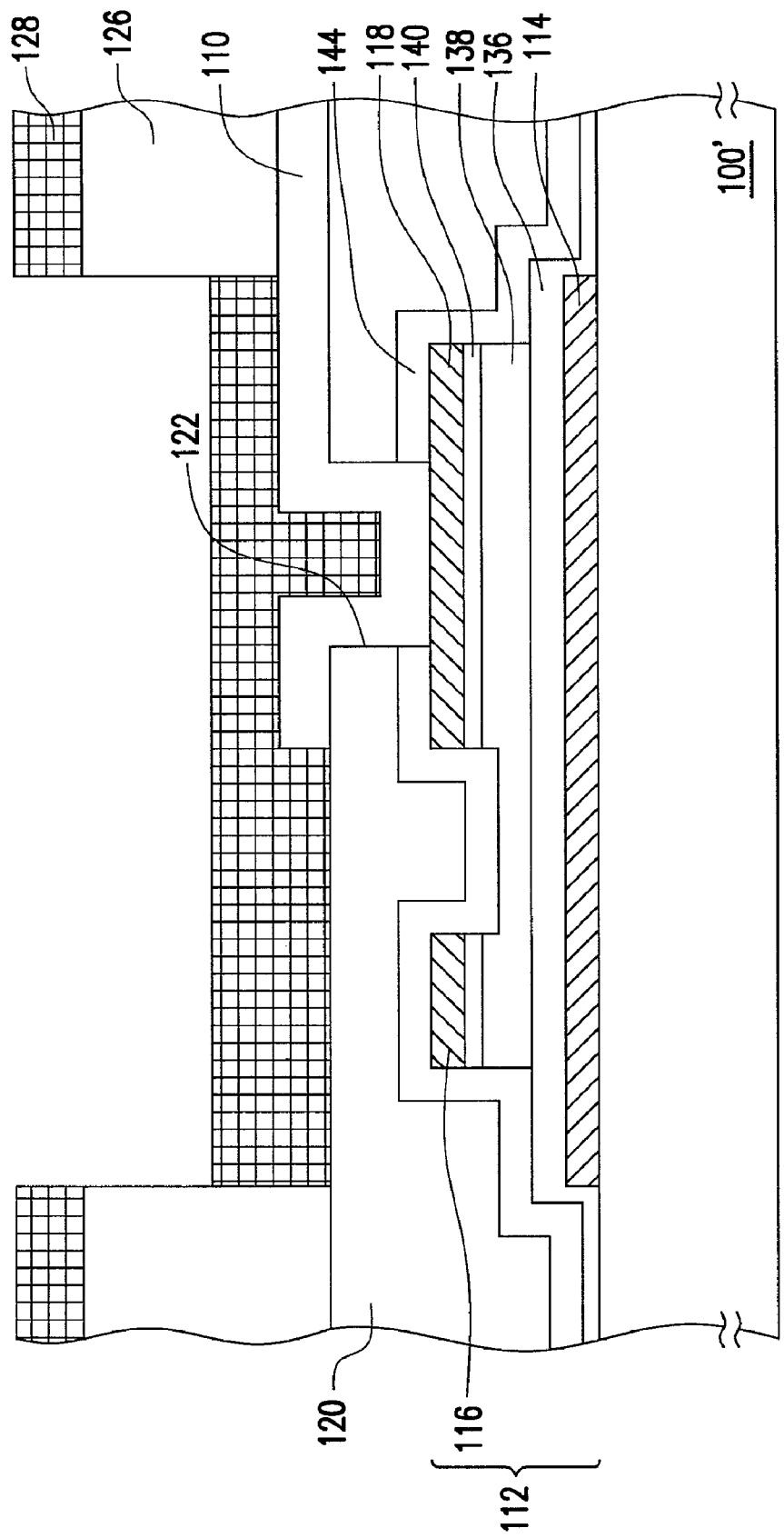

Next, referring to FIG. 2C, a development process is performed on the negative photoresist layer 124 to remove the negative photoresist layer 124 above the opaque metal layer such as the gate 114, the source 116, and the drain 118 to form a patterned negative photoresist layer 126.

Next, a black light-shielding layer 128 is formed over the substrate 100' to cover the patterned negative photoresist layer 126, the planarization layer 120 and the pixel electrode 110. The material of the black light-shielding layer 128 can be black resin, chromium, or chromic oxide, or other opaque metal material. It should be noted that, if the material of the black light-shielding layer 128 is chromium or other opaque metal material, a transparent insulation layer (not shown) must be formed between the pixel electrode 110 and the black light-shielding layer 128 to avoid short circuit between the pixel electrode 110 and the black light-shielding layer 128.

Figure 2D:
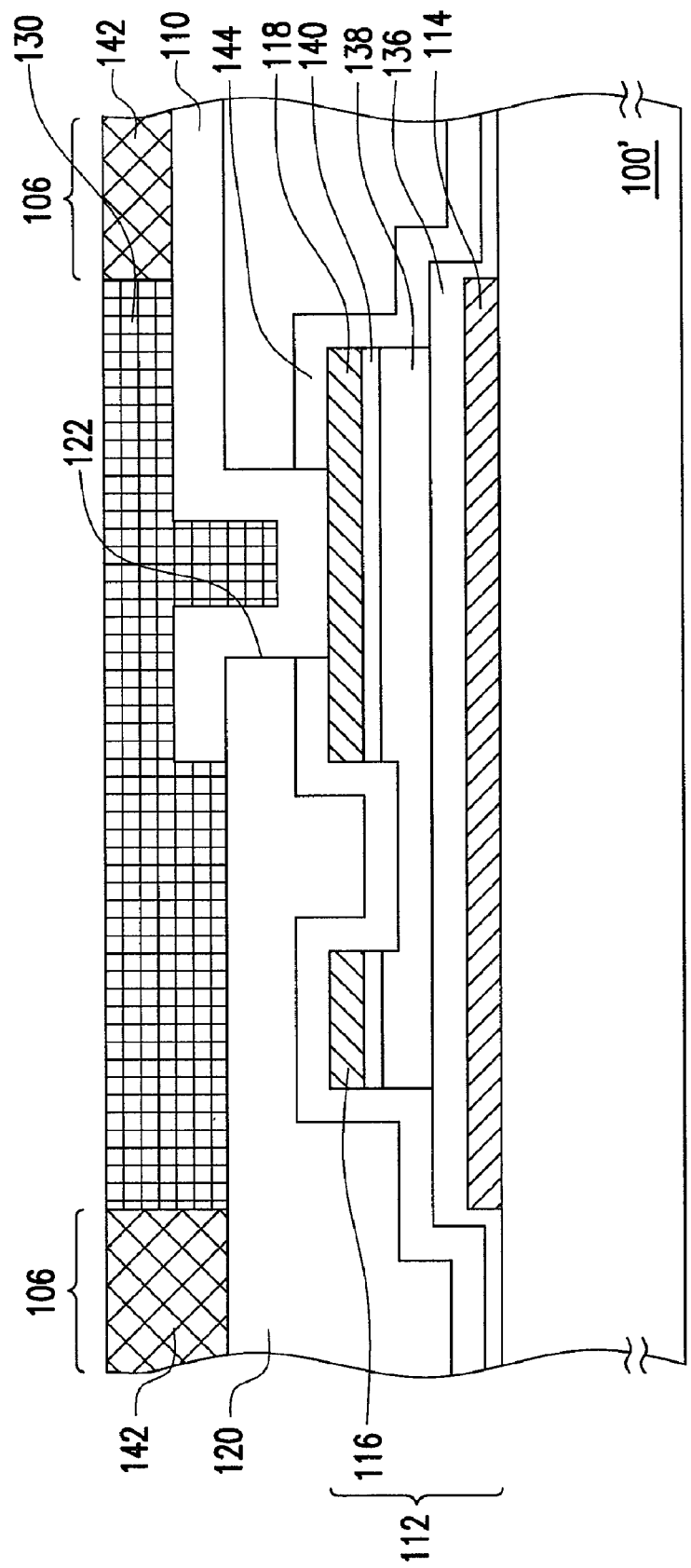

Next, referring to FIG. 2D, the patterned negative photoresist layer 126 and the black light-shielding layer 128 (as shown in FIG. 2C) located on the patterned negative photoresist layer 126 are removed to form a black matrix 130 above the opaque metal layers such as the gate 114, the source 116 and the drain 118. The black matrix 130 defines pixel regions 106. For example, the patterned negative photoresist layer 126 and the black light-shielding layer 128 located on the patterned negative photoresist layer 126 are removed by a lift-off process.

Next, color filter patterns 142 are formed in the pixel regions 106. The color filter patterns 142 include a red filter pattern, a green filter pattern, or a blue filter pattern. The material of the color filter patterns 142 includes a photoresist material. For example, the color filter patterns 142 are formed through coating, exposing, developing, baking, and grinding the red, green or blue photoresist.

Figure 3A:
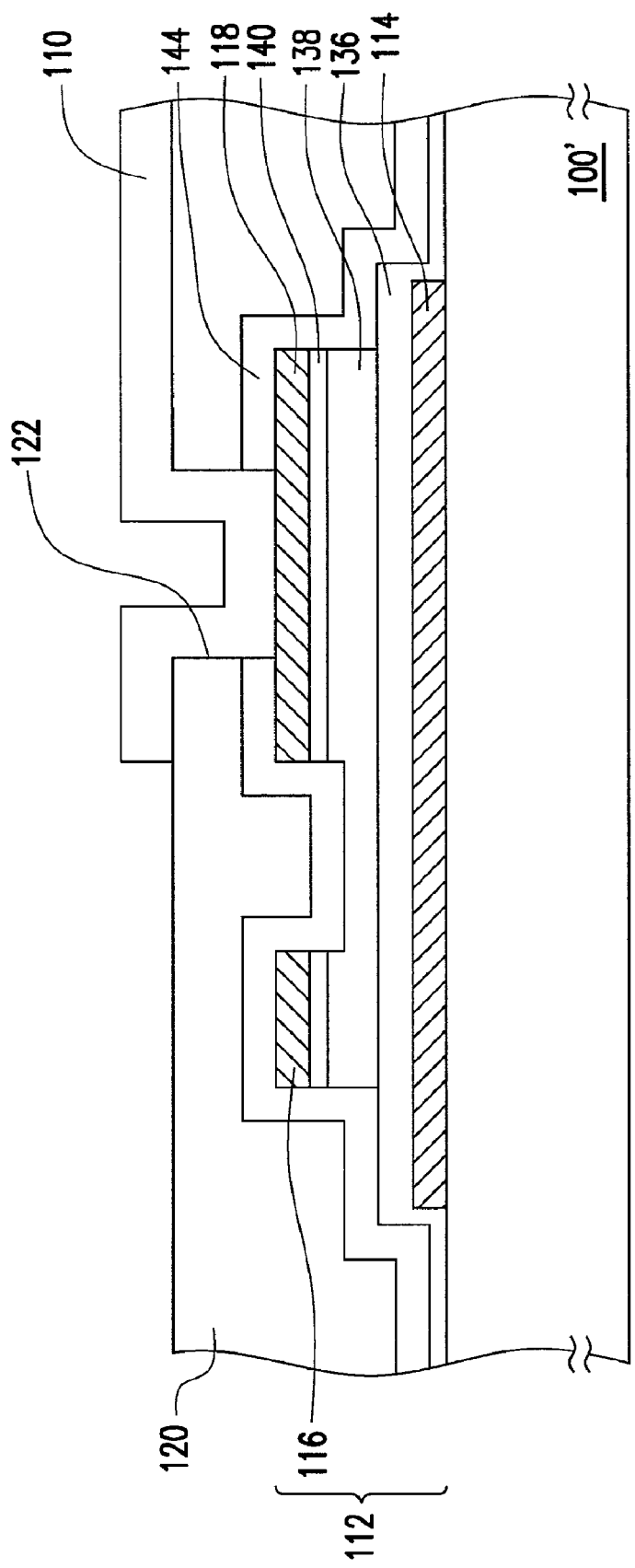
FIGS. 3A to 3C are cross-sectional views taken along a section line A-A' in FIG. 1 showing the steps of a method of fabricating a color filter layer according to another embodiment of the present invention.
Figure 3B:
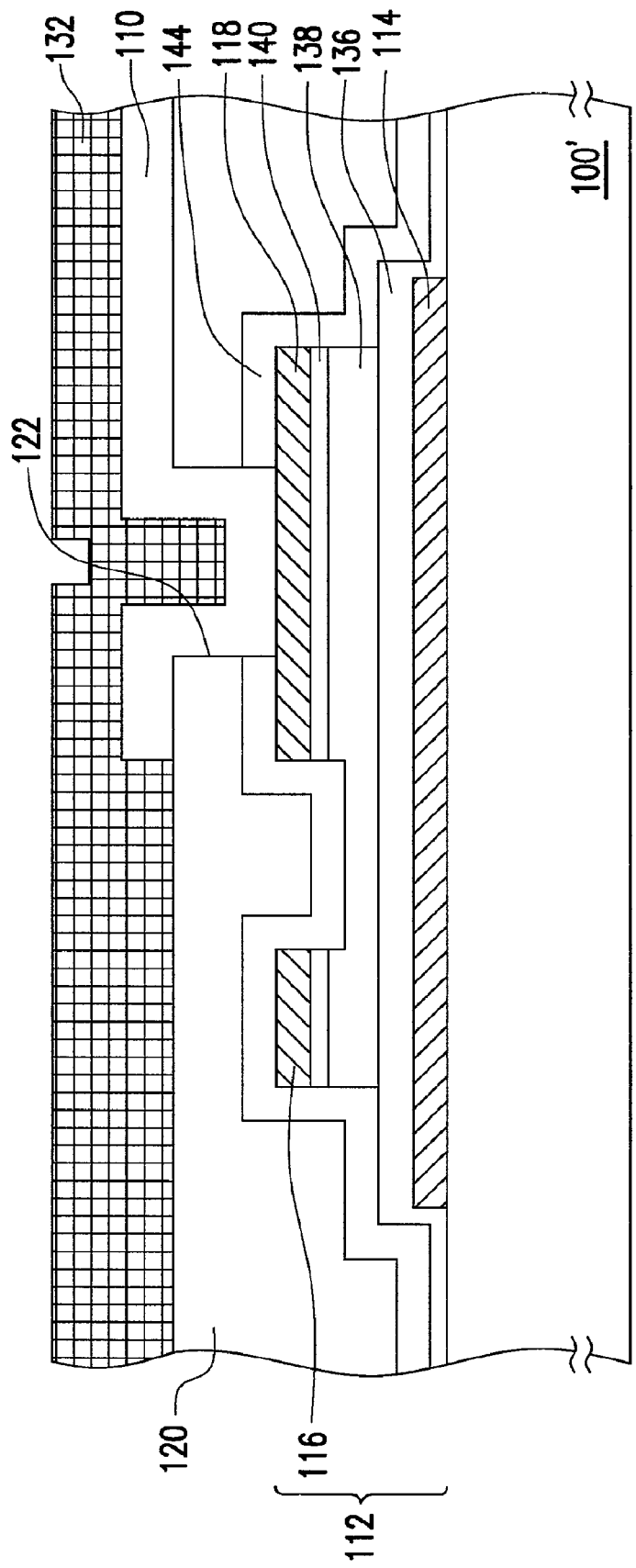
Figure 3C:
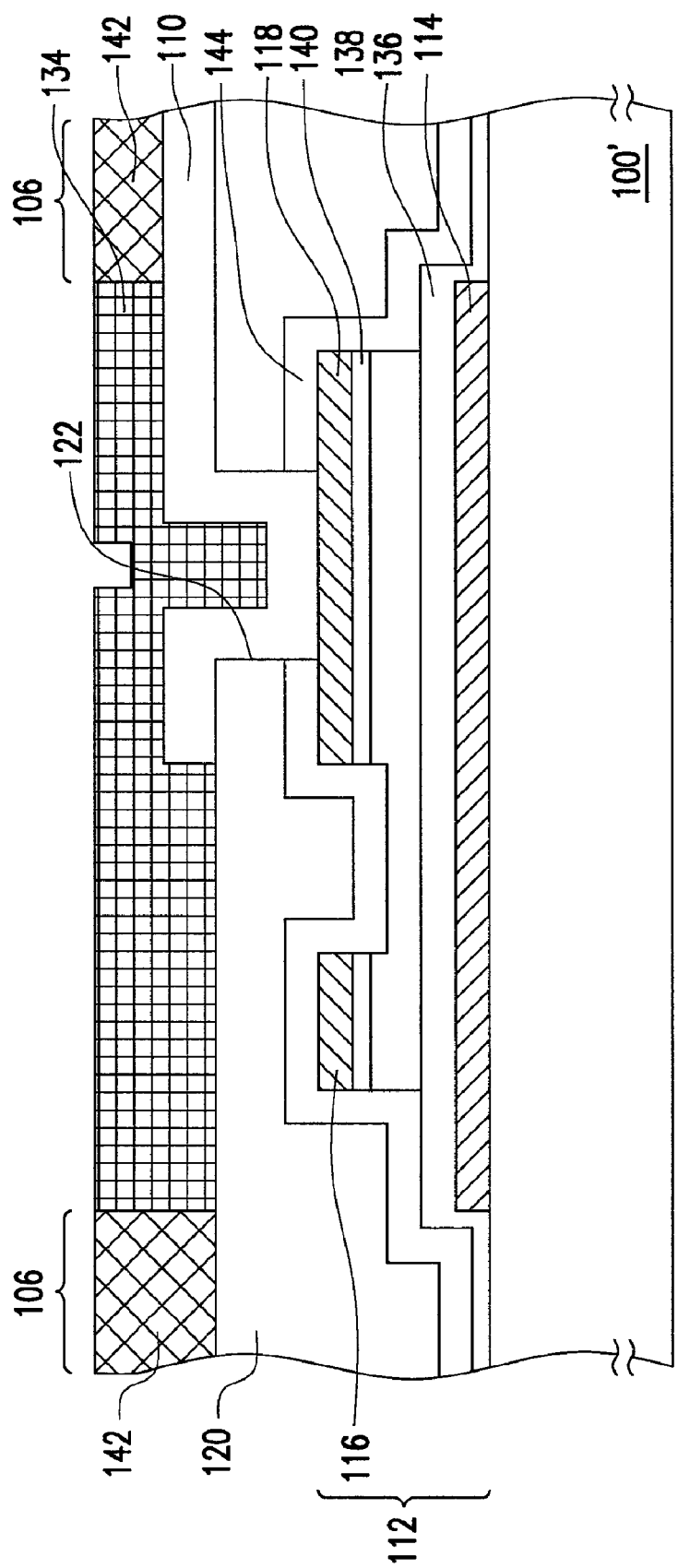

FIGS. 3A to 3C are cross-sectional views taken along a section line A-A' in FIG. 1 showing the steps of a method of fabricating a color filter layer according to another embodiment of the present invention.

First, referring to FIG. 3A, a substrate 100' having the TFT 112 formed thereon is provided. The opaque metal patterns of the TFT 112 is comprising the gate 114 (in the same metal layer as the scan line 102 in FIG. 1), the source 116, and the drain 118 (in the same metal layer as the data line 104 in FIG. 1). A planarization layer 120 covers the TFT 112, and has an opening 122 for exposing the drain 118. A pixel electrode 110 is electrically connected to the drain 118 through the opening 122. A gate dielectric layer 136, a semiconductor layer 138, and an ohmic contact layer 140 are sequentially disposed between the gate 114 and the source 116, the drain 118 from bottom to top. A protection layer 144 is disposed between the planarization layer 120 and the source 116, the drain 118.

Next, referring to FIG. 3B, a black positive photoresist layer 132 is formed on the substrate 100' to cover the planarization layer 120 and the pixel electrode 110. Next, a back-side exposure process is performed on the black positive photoresist layer 132 using an opaque metal layer such as the gate 114, the source 116, and the drain 118 of the TFT 112 as a mask.

Next, referring to FIG. 3C, a development process is performed on the black positive photoresist layer 132 (shown in FIG. 3B) to remove the black positive photoresist layer 132 not located above the opaque metal layer such as the gate 114, the source 116, and the drain 118 to form a black matrix 134. The black matrix 134 defines pixel regions 106.

Next, the color filter patterns 142 are formed in the pixel regions 106. The color filter patterns 142 include a red filter pattern, a green filter pattern, or a blue filter pattern. The material of the color filter patterns 142 includes a photoresist material. For example, the color filter patterns 142 are formed through coating, exposing, developing, baking, and grinding the red, green, or blue photoresist.

Referring to both FIGS. 1A and 1B, in order to form the color filter layers on the active device array substrate 100 in FIG. 1A employing the process described with reference FIGS. 2A to 2D (or in FIGS. 3A to 3C) above, a back-side exposure process is preformed using the opaque metal patterns such as the scan lines 102, the data lines 104, the common lines 108, and the gates 114, the sources 116, and the drains 118 of the TFTs 112 are served as the mask to form the black matrix 130 (or 134) on the active device array substrate 100, and the black matrix 130 (or 134) defines pixel regions 106. Next, the color filter patterns 142 are formed in the pixel regions 106 defined by the black matrix 130 (or 134).

Since the black matrix 130 or 134 is formed on the active device array substrate 100 through a back-side exposure process by using the opaque metal patterns such as the scan lines 102, the data lines 104, the common lines 108, and the gates 114, the sources 116 and the drains 118 of the TFTs 112 as the mask, and therefore the possibility of occurrence of alignment errors during the fabrication of the black matrix 130 or 134 may be effectively reduced, this is also helpful for reducing the errors during the assembly of the color filter layer. According to another aspect of the present invention, at least one photomask is saved, and therefore the fabrication cost of the panel may be effectively reduced.

Referring to FIGS. 1A and 1B, the black matrix 130 (or 134) in FIG. 1B is disposed on the active device array substrate 100, and located above the opaque metal patterns such as the scan lines 102, the data lines 104, the common lines 108 in the active device array substrate 100 and the gates 114, the sources 116, and the drains 118 of the TFTs 112 in FIG. 1A, and the black matrix 130 (or 134) has the same pattern as the opaque metal pattern formed by the scan lines 102, the data lines 104, and the common lines 108, and the gates 114, the sources 116, and the drains 118 of the TFTs 112, and therefore the aperture ratio may be effectively increased.

Figure 4:
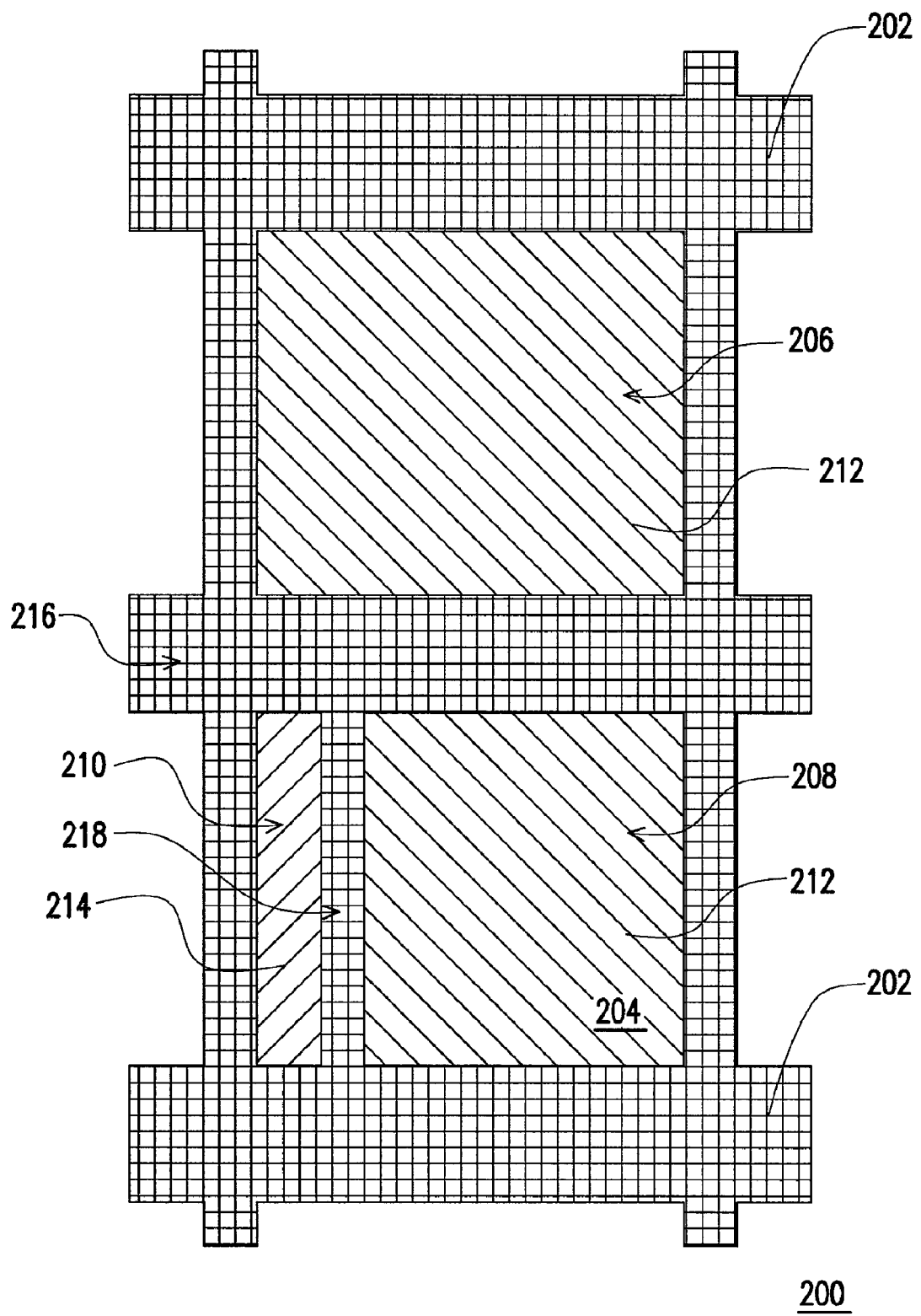
FIG. 4 is a top view of the color filter layer according to another embodiment of the present invention.

FIG. 4 is a top view of the color filter layer according to another embodiment of the present invention.

Referring to FIG. 4, according to the design of the active device array substrate 200, the pixel region 204 defined by the black matrix 202 are divided into a first region 206, a second region 208, and a third region 210. In FIG. 4, the black matrix 202 defines the third region 210, that is because a metal wire 218 is provided between the common line 216 and the drain (not shown) when designing the pixel, such that a contact window between the drain and the pixel electrode (not shown) is moved to the common line.

As shown in FIG. 4, the pixel region 204 includes two or more types of color filter patterns, thereby adjusting the color shade of the panel. The color filter pattern may be a red filter pattern, a green filter pattern, or a blue filter pattern. For example, the red filter pattern 212 is disposed in the first region 206 and the second region 208, and the green filter pattern 214 is disposed in the third region 210, so as to improve the color shade.

In view of the above, the present invention at least has the follow advantages.

1. Alignment errors during the fabrication of a black matrix may be effectively reduced, which is helpful for reducing the errors during the assembly of the color filter layer.

2. At least one photomask may be saved for fabricating the color filter, and therefore the fabrication cost of the panel may be substantially reduced.

3. The method of fabricating the color filter layer of the present invention may increase the aperture ratio.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of fabricating a color filter layer, comprising:
   providing an active device array substrate having an opaque metal pattern formed thereon;
   forming a planarization layer covering the opaque metal pattern;
   performing a back-side exposure process on the active device array substrate using the opaque metal pattern as a mask to form a black matrix thereon, wherein the black matrix defines a plurality of pixel regions; and
   forming a plurality of color filter patterns in the pixel regions, wherein each of the pixel regions includes two or more types of the color filter patterns.

2. The method of fabricating the color filter layer of claim 1, wherein the active device array substrate comprises a thin film transistor (TFT) array substrate having a plurality of TFTs.

3. The method of fabricating the color filter layer of claim 2, wherein the opaque metal pattern comprises a source and a drain of each TFT.

4. The method of fabricating the color filter layer as claimed in claim 2, wherein the opaque metal pattern comprises a gate of each TFT.

5. The method of fabricating the color filter layer of claim 1, wherein the opaque metal pattern comprises scan lines of the active device array substrate.

6. The method of fabricating the color filter layer of claim 1, wherein the opaque metal pattern comprises data lines of the active device array substrate.

7. The method of fabricating the color filter layer of claim 1, wherein the opaque metal pattern comprises common lines of the active device array substrate.

8. The method of fabricating the color filter layer of claim 1, wherein each color filter pattern comprises a red filter pattern, a green filter pattern, or a blue filter pattern.

9. The method of fabricating the color filter layer of claim 1, wherein a material of each color filter pattern comprises a photoresist material.

10. The method of fabricating the color filter layer of claim 1, wherein a single pixel electrode corresponds to two or more types of the color filter patterns with different colors.

11. The method of fabricating the color filter layer of claim 1, further comprising:
    forming a pixel electrode on the planarization layer, wherein the black matrix is formed after the pixel electrode is formed.

12. The method of fabricating the color filter layer of claim 1, wherein the opaque metal pattern includes scan lines and data lines of the active device array substrate, and the regions defined by the scan lines and the data lines are corresponding to the pixel regions.

13. A method of fabricating a color filter layer, comprising:
    providing an active device array substrate having an opaque metal pattern formed thereon;
    forming a planarization layer covering the opaque metal pattern;
    forming a black positive photoresist layer to cover the planarization layer;
    performing a back-side exposure process to expose the black positive photoresist layer using the opaque metal pattern as a mask;
    performing a development process such that the black positive photoresist layer is transformed into a patterned black positive photoresist layer to define a plurality of pixel regions; and
    forming a plurality of color filter patterns in the pixel regions, wherein each of the pixel regions includes two or more types of the color filter patterns.

14. The method of fabricating the color filter layer of claim 13, wherein the active device array substrate comprises a TFT array substrate having a plurality of TFTs.

15. The method of fabricating the color filter layer of claim 14, wherein the opaque metal pattern comprises a source and a drain of each TFT.

16. The method of fabricating the color filter layer of claim 14, wherein the opaque metal pattern comprises a gate of each TFT.

17. The method of fabricating the color filter layer of claim 13, wherein the opaque metal pattern comprises scan lines of the active device array substrate.

18. The method of fabricating the color filter layer of claim 13, wherein the opaque metal pattern comprises data lines of the active device array substrate.

19. The method of fabricating the color filter layer of claim 13, wherein the opaque metal pattern comprises common lines of the active device array substrate.

20. The method of fabricating the color filter layer of claim 13, wherein each color filter pattern comprises a red filter pattern, a green filter pattern, or a blue filter pattern.

21. The method of fabricating the color filter layer of claim 13, wherein a material of each color filter pattern comprises a photoresist material.

22. The method of fabricating the color filter layer of claim 13, wherein a single pixel electrode corresponds to two or more types of the color filter patterns with different colors.

23. The method of fabricating the color filter layer of claim 13, further comprising:
    forming a pixel electrode on the planarization layer, wherein the black positive photoresist layer is formed after the pixel electrode is formed.

24. The method of fabricating the color filter layer of claim 13, wherein the opaque metal pattern includes scan lines and data lines of the active device array substrate, and the regions defined by the scan lines and the data lines are corresponding to the pixel regions.

* * * * *